(12) United States Patent
Boyanov et al.

(10) Patent No.: US 9,064,872 B2
(45) Date of Patent: Jun. 23, 2015

(54) SEMICONDUCTOR INTERCONNECT STRUCTURES

(71) Applicant: Intel Coporation, Santa Clara, CA (US)

(72) Inventors: Boyan Boyanov, San Diego, CA (US); Kanwal Singh, Hillsboro, OR (US); James Clarke, Portland, OR (US); Alan Myers, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/323,246

(22) Filed: Jul. 3, 2014

(65) Prior Publication Data

US 2014/0312508 A1      Oct. 23, 2014

Related U.S. Application Data

(63) Continuation of application No. 13/693,598, filed on Dec. 4, 2012, now Pat. No. 8,772,938.

(51) Int. Cl.
 *H01L 21/47* (2006.01)
 *H01L 23/528* (2006.01)
 (Continued)

(52) U.S. Cl.
 CPC .......... *H01L 23/528* (2013.01); *H01L 23/5226* (2013.01); *H01L 21/76831* (2013.01); *H01L 23/5329* (2013.01); *H01L 23/53295* (2013.01); *H01L 2924/0002* (2013.01)

(58) Field of Classification Search
 CPC .................................................. H01L 23/5226
 USPC ........... 257/758, E21.576, E21.577, E21.579, 257/E21.582
 See application file for complete search history.

(56) References Cited

U.S. PATENT DOCUMENTS

| | | |
|---|---|---|
| 5,214,283 A | 5/1993 | Le |
| 5,407,860 A | 4/1995 | Stoltz et al. |

(Continued)

FOREIGN PATENT DOCUMENTS

| | | |
|---|---|---|
| JP | 2002-050686 A | 2/2002 |
| KR | 10-2001-0003760 A | 1/2001 |

(Continued)

OTHER PUBLICATIONS

Office Action received for United Kingdom Patent Application No. 0819769.1, mailed on Dec. 9, 2010, 3 pages.

(Continued)

*Primary Examiner* — Roy Potter
*Assistant Examiner* — Paul Patton
(74) *Attorney, Agent, or Firm* — Finch & Maloney PLLC

(57) ABSTRACT

Techniques are disclosed that enable improved shorting margin between unlanded conductive interconnect features and neighboring conductive features. In some embodiments, an etch may be applied to an insulator layer having one or more conductive features therein, such that the insulator layer is recessed below the top of the conductive features and the edges of the conductive features are rounded or otherwise softened. A conformal etch stop layer may then be deposited over the conductive features and the insulator material. A second insulator layer may be deposited above the conformal etch stop layer, and an interconnect feature may pass through the second insulator layer and the conformal etch stop layer to connect with the rounded portion of one of the conductive features. In some embodiments, the interconnect feature is an unlanded via and the unlanded portion of the via may or may not penetrate through the conformal barrier layer.

20 Claims, 9 Drawing Sheets

(51) Int. Cl.
*H01L 23/522* (2006.01)
*H01L 21/768* (2006.01)
*H01L 23/532* (2006.01)

(56) References Cited

U.S. PATENT DOCUMENTS

| | | |
|---|---|---|
| 5,656,543 A | 8/1997 | Chung |
| 5,759,913 A | 6/1998 | Fulford et al. |
| 5,876,798 A | 3/1999 | Vassiliev |
| 5,880,018 A | 3/1999 | Boeck et al. |
| 5,982,035 A | 11/1999 | Tran et al. |
| 6,035,530 A | 3/2000 | Hong |
| 6,064,118 A | 5/2000 | Sasaki |
| 6,110,819 A | 8/2000 | Colgan et al. |
| 6,191,027 B1 | 2/2001 | Omura |
| 6,207,556 B1 | 3/2001 | Hsu |
| 6,226,171 B1 | 5/2001 | Beilin et al. |
| 6,252,290 B1 | 6/2001 | Quek et al. |
| 6,255,224 B1 | 7/2001 | Kim |
| 6,265,321 B1 | 7/2001 | Chooi et al. |
| 6,300,236 B1 | 10/2001 | Harper et al. |
| 6,303,404 B1 | 10/2001 | Moon et al. |
| 6,303,464 B1 | 10/2001 | Gaw et al. |
| 6,309,970 B1 | 10/2001 | Ito et al. |
| 6,362,073 B2 | 3/2002 | Kim |
| 6,368,939 B1 | 4/2002 | Sasaki |
| 6,423,630 B1 | 7/2002 | Catabay et al. |
| 6,440,839 B1 | 8/2002 | Partovi et al. |
| 6,472,266 B1 | 10/2002 | Yu et al. |
| 6,489,195 B1 | 12/2002 | Hwang et al. |
| 6,495,445 B2 | 12/2002 | Clevenger et al. |
| 6,577,011 B1 | 6/2003 | Buchwalter et al. |
| 6,737,725 B2 | 5/2004 | Grill et al. |
| 6,888,244 B2 | 5/2005 | Engelhardt et al. |
| 6,890,846 B2 * | 5/2005 | Noguchi ............... 438/622 |
| 6,897,508 B2 | 5/2005 | Sneh |
| 6,974,772 B1 * | 12/2005 | King et al. ............ 438/637 |
| 6,995,073 B2 | 2/2006 | Liou |
| 7,030,005 B2 | 4/2006 | Lee |
| 7,030,499 B2 | 4/2006 | Hermes |
| 7,042,095 B2 | 5/2006 | Noguchi et al. |
| 7,144,803 B2 | 12/2006 | Engbrecht et al. |
| 7,312,512 B2 | 12/2007 | Lu et al. |
| 7,358,594 B1 | 4/2008 | Allman et al. |
| 7,392,746 B2 | 7/2008 | Hansen |
| 7,393,776 B2 | 7/2008 | Colburn et al. |
| 7,473,632 B2 | 1/2009 | Ueda |
| 7,579,233 B2 | 8/2009 | Hwang |
| 7,649,239 B2 | 1/2010 | Hussein et al. |
| 7,772,702 B2 | 8/2010 | Bielefeld et al. |
| 7,772,706 B2 * | 8/2010 | Balakrishnan et al. ....... 257/774 |
| 7,923,760 B2 | 4/2011 | Hussein et al. |
| 8,394,701 B2 | 3/2013 | Hussein et al. |
| 8,772,938 B2 | 7/2014 | Boyanov et al. |
| 2001/0016412 A1 | 8/2001 | Lee et al. |
| 2001/0040267 A1 | 11/2001 | Lien et al. |
| 2001/0045658 A1 | 11/2001 | Deboer et al. |
| 2001/0051423 A1 | 12/2001 | Kim et al. |
| 2002/0127844 A1 | 9/2002 | Grill et al. |
| 2002/0140101 A1 | 10/2002 | Yang et al. |
| 2003/0183940 A1 | 10/2003 | Noguchi et al. |
| 2003/0224591 A1 | 12/2003 | Latchford et al. |
| 2004/0063305 A1 | 4/2004 | Kloster et al. |
| 2004/0084774 A1 | 5/2004 | Li et al. |
| 2004/0121577 A1 | 6/2004 | Yu et al. |
| 2004/0214427 A1 | 10/2004 | Kloster et al. |
| 2004/0266167 A1 | 12/2004 | Dubin et al. |
| 2005/0012219 A1 | 1/2005 | Liou |
| 2005/0062165 A1 | 3/2005 | Saenger et al. |
| 2005/0079700 A1 | 4/2005 | Schindler et al. |
| 2005/0184397 A1 | 8/2005 | Gates et al. |
| 2005/0272256 A1 | 12/2005 | Wang |
| 2005/0285269 A1 | 12/2005 | Cao et al. |
| 2006/0063373 A1 | 3/2006 | Gambino et al. |
| 2006/0170110 A1 | 8/2006 | Akram et al. |
| 2006/0197230 A1 | 9/2006 | Anezaki et al. |
| 2006/0286758 A1 | 12/2006 | Liang et al. |
| 2007/0269956 A1 | 11/2007 | Lavoie et al. |
| 2007/0298564 A1 * | 12/2007 | Brar et al. ............ 438/212 |
| 2008/0108219 A1 | 5/2008 | Huebinger et al. |
| 2008/0166870 A1 | 7/2008 | Huang et al. |
| 2009/0121360 A1 | 5/2009 | Takewaki |
| 2014/0117558 A1 | 5/2014 | Boyanov |
| 2014/0151893 A1 | 6/2014 | Boyanov et al. |

FOREIGN PATENT DOCUMENTS

| | | |
|---|---|---|
| KR | 10-2003-0002523 A | 1/2003 |
| KR | 10-2003-0049563 A | 6/2003 |
| KR | 10-2005-0057784 A | 6/2005 |
| WO | 2007/130368 A2 | 11/2007 |
| WO | 2007/130368 A3 | 12/2007 |
| WO | 2008/036385 A1 | 3/2008 |
| WO | 2009/085506 A1 | 7/2009 |
| WO | 2013/101204 A1 | 7/2013 |

OTHER PUBLICATIONS

Office Action received for German Application No. 112007000966.7, mailed on Nov. 7, 2012, 7 pages of Office Action including 2 pages of translation.

International Preliminary Report on Patentability with Written Opinion received for PCT Patent Application No. PCT/US2011/068159, mailed on Jul. 10, 2014, 7 Pages.

Office Action received for German Patent Application No. 112007000966.7, mailed on May 15, 2013, 2 Pages of Office Action and 2 Pages of English Translation.

International Preliminary Report on Patentability and Written Opinion received for PCT Patent Application No. PCT/US2008/084680, mailed on Jul. 8, 2010, 8 Pages.

International Search Report and Written Opinion received for PCT Patent Application No. PCT/US2008/084680, mailed on Mar. 24, 2009, 14 Pages.

Office Action received for German Patent Application No. 112007002215.9, mailed on May 28, 2009, 2 Pages of Office Action and 2 Pages of English Translation.

Office Action received for German Patent Application No. 112007002215.9, mailed on Oct. 7, 2010, 6 pages of Office Action and 7 Pages of English Translation.

Notice of Allowance received for Chinese Patent Application No. 200780015999.5, mailed on Jul. 16, 2010, 2 Pages of Office Action and 3 Pages of English Translation.

Notice of Allowance received for Chinese Patent Application No. 200780031072.0, mailed on Jun. 22, 2010, 2 Pages of Office Action and 2 Pages of English Translation.

Office Action received for Chinese Application No. 200780031072.0, mailed on Dec. 11, 2009, 3 pages of Office Action and 1 Page of English Translation.

International Search Report and Written opinion received for PCT Patent Application No. PCT/US2011/068159, mailed on Aug. 9, 2012, 11 pages.

Office Action received for Taiwan Patent Application No. 96115614, mailed on Dec. 7, 2010, 6 pages of Taiwan Office Action including 1 page of search report.

Notice of Allowance received for Taiwan Patent Application No. 96135408, mailed on Mar. 28, 2013, 2 Pages of Notice of Allowance and 1 Page of English Translation.

Office Action received for Taiwan Patent Application No. 96135408, mailed on Feb. 24, 2012, 5 pages of Office Action.

Office Action received for Taiwan Patent Application No. 96135408, mailed on May 25, 2011, 7 pages of Office Action including 1 page of search report.

Non Final Office Action received on U.S. Appl. No. 13/693,598. Mailed on Oct. 25, 2013. 10 pages.

(56) References Cited

OTHER PUBLICATIONS

Office Action received for Taiwan Patent Application No. 97147663, mailed on Apr. 11, 2012, 6 pages of Office Action and 1 page of English Translation.

Chan et al., "Air-Gap Fabrication Using a Sacrificial Polymeric Thin Film Synthesized via Initiated Chemical Vapor Deposition", Journal of the Electromechanical Society, 153(4), 2006, pp. C223-C228.

Noguchi et al., "Process and Reliability of Air-Gap Cu Interconnect Using 90-nm Node Technology", IEEE Transactions on Electron Devices, vol. 52, No. 3, Mar. 2005, pp. 352-359.

International Preliminary Report on Patentability and Written Opinion received for PCT Patent Application No. PCT/US2007/010484, mailed on Nov. 13, 2008, 8 pages.

International Search Report and Written Opinion received for PCT Patent Application No. PCT/US2007/010484, mailed on Nov. 8, 2007, 10 pages.

International Preliminary Report on Patentability and Written opinion received for PCT Patent Application No. PCT/US2007/020443, mailed on Apr. 2, 2009, 5 pages.

International Search Report and Written Opinion received for PCT Patent Application No. PCT/US2007/020443, mailed on Jan. 25, 2008, 9 pages.

\* cited by examiner

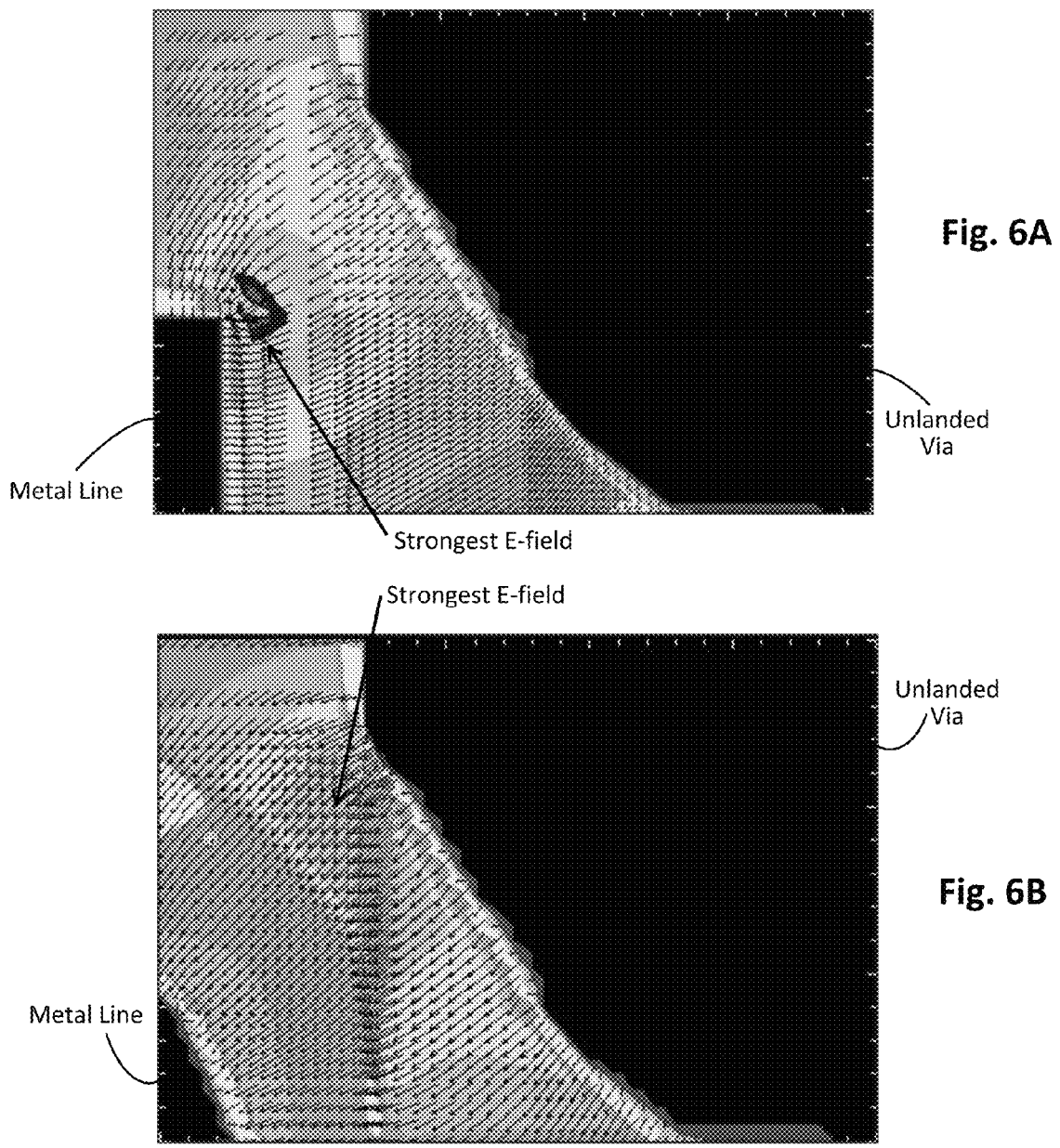

US 9,064,872 B2

SEMICONDUCTOR INTERCONNECT STRUCTURES

RELATED APPLICATION

The present application is a continuation of U.S. patent application Ser. No. 13/693,598 filed on Dec. 4, 2012.

BACKGROUND

In the manufacture of integrated circuits, interconnects may be formed on a semiconductor substrate using a copper damascene process. Such a process typically begins with a trench and/or via being etched into an insulator layer and then filled with copper metal to form the interconnect. It is often desirable to stack multiple layers to form an integrated circuit, by adding additional layers of insulator and metal-filled features. In such cases, various interconnect features can be used to electrically connect one layer to another, as desired for a given integrated circuit design. However, as device dimensions continue to scale down, the various interconnect features become narrower and closer together giving rise to a number of non-trivial problems.

BRIEF DESCRIPTION OF THE DRAWINGS

FIGS. 6A-B illustrate a simulation comparing electrical field strengths in a conventional stacked conductive interconnect structure and a stacked conductive interconnect structure configured in accordance with one embodiment of the present invention.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed that enable improved shorting margin between unlanded conductive interconnect features (e.g., vias) and neighboring conductive features of an integrated circuit. As will be appreciated in light of this disclosure, an unlanded interconnect feature is one where part of the feature is on its target landing pad and part of the feature is not on the target landing pad. The area adjacent to the intended target landing pad is generally referred to herein as the off-target landing pad. The techniques provided are particularly useful, for instance, when lithography registration errors cause neighboring conductive features to be physically closer than expected, but can also be used when such proximity is intentional (such as in integrated circuits where high packing density is desired). In some embodiments, the techniques can be implemented by exposing an integrated circuit layer having an inter-layer dielectric (ILD) and one or more metal (or otherwise conductive) lines to a short unmasked etch, recessing the ILD and rounding the edges/corners of the conductive lines above the ILD. The rounding of the conductive lines may be the result of the different etch rates of the metal/conductive material and ILD material. A conformal etchstop layer may be deposited over the ILD material and rounded conductive lines, and an upper ILD layer may be deposited over the conformal etchstop layer. An interconnect feature may be patterned and etched into the upper ILD layer, creating an unlanded via that may partially contact one of the rounded conductive lines. In some such embodiments, the conformal etchstop can be effectively planarized or otherwise selectively extended with an additional deposition of material so as to provide a thicker etchstop over off-target landing pad areas. Numerous configurations and variations will be apparent in light of this disclosure.

General Overview

Figure 1:
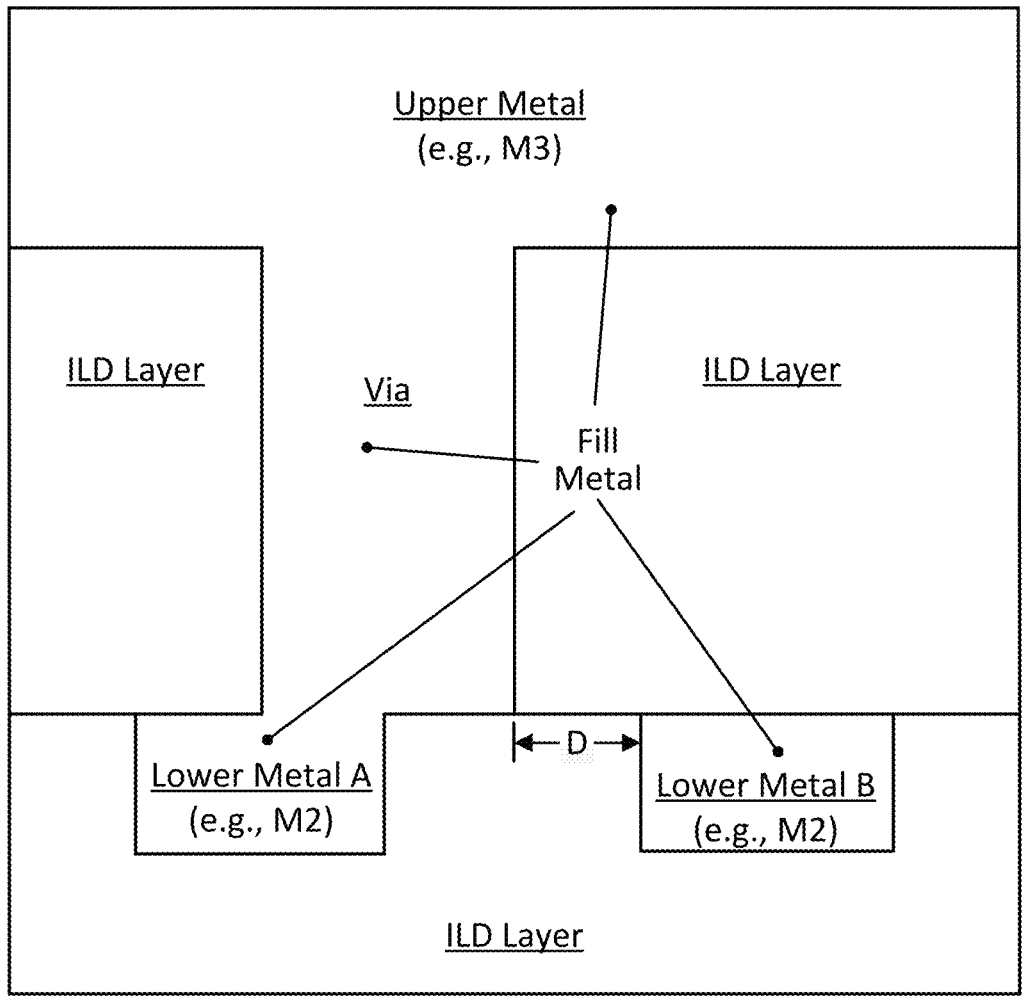
FIG. 1 illustrates an example stacked conductive interconnect feature showing an unlanded via.

As previously explained, it is often desirable to stack multiple layers of an integrated circuit by adding additional layers of insulator and metal-filled features, using standard deposition lithography techniques. The scaling of such conventional processes to provide smaller feature sizes can be difficult because of, for example, increased significance of lithography registration errors. For instance, FIG. 1 shows an example interconnect structure illustrating the problematic shifting associated with lithography registration errors. As can be seen, the via intended to connect the upper metal (e.g., M3) with the lower metal A (e.g., M2) is misaligned and therefore shifted closer to the neighboring lower metal B, thereby leaving a reduced distance D between the conductive features. This reduced spacing can lead to insufficient shorting margin and decreased time-dependent dielectric breakdown (TDDB), or even a complete short-circuit. Note that even when the via does not completely short to the neighboring conductor, the distance D may be decreased to a point where the separating insulator is not capable of withstanding the typical fields generated by, for instance, a ~1V power supply. In one specific example, the E-fields present between an unlanded via and an adjacent metal line can be in excess of 2 MV/cm. The end result may be yield fallout in the case of shorting, or decreased reliability when the space D is incapable of supporting the operating field. As will be appreciated, while specific example via and metal layers are used herein for illustration purposes, this issue can exist at all lower metal layers (e.g., M1 through M9, etc.) and in a more general sense, in any integrated circuit structure having multiple layers of conductive features susceptible to insufficient shorting margin resulting from lithography registration errors or high packing density.

Thus, and in accordance with one embodiment, techniques are provided for forming conductive interconnect features, such as through-vias and damascene features (e.g., trench/via structures) for electrically connecting one layer of an integrated circuit to another layer of that integrated circuit. According to one embodiment, a number of metal lines may be embedded within an ILD base layer. In one specific example, the metal lines are made of copper, although other suitably conductive materials can be used. This metal layer may be exposed to an unmasked etch which can recess the ILD layer below the top of the metal lines and effectively round the edges/corners of the exposed metal lines. This rounding may manifest in a number of ways. For instance, in some such cases, the central portion of the exposed metal line is effectively higher than the edges/corners of the exposed metal lines (e.g., like an upside-down U, or like ∩). In other such cases, the distance between the corners/edges of the top surface of the exposed metal line is effectively shorter post-etch, as compared to the pre-etch distance between those corners/edges, given the tapering effect that the unmasked etch causes. In a more general sense, the post-etch distance between opposing edges of the exposed metal line are shorter than pre-etch distances. In some specific cases, for instance, the etch selectivity with respect to the ILD and metal layers is greater than 10:1, such that the metal layer etches more than 10 times slower than the base ILD material for a given etch process. As will be appreciated, however, note that etch selectivity will vary from one embodiment to the next depending on factors such as insulator and/or conductive materials chosen as well as layer thicknesses and etch chemistries and desired shorting margin, and the disclosure is not intended to be limited to any particular etch rate scheme. Rather, any etch rate scheme that enables a rounding or edge softening of the metal lines, as described herein, can be used (e.g., such as those where the etch selectivity with respect to the ILD and metal is greater than 1:1, or greater than 2:1, etc.). A conformal etchstop layer may then be deposited over the metal line and the ILD layer. In one embodiment, the ILD is implemented with a low-k material, and the etchstop layer has a higher dielectric constant than the low-k ILD and an increased resistance to dielectric breakdown. A second ILD layer may then be deposited over the etchstop, and another etch may create a trench and via. If the via is partially landed, the landed portion of the via may contact the top of the metal line before the unlanded portion penetrates the etchstop above the off-target landing pad, due to the vertical offset of the etchstop over the off-target landing pad compared to the etchstop over the metal line. In this specific example, because the unlanded portion of the via does not penetrate the etchstop above the ILD layer, the E-field between the via and the adjacent metal line may be reduced across the etchstop. Additionally, eliminating the sharp corners of the adjacent metal line may reduce the E-field. The E-field may be further reduced because the rounded or otherwise softened edges/corners of the metal lines can increase the distance between the unlanded via and an adjacent metal line. In some embodiments, an additional etchstop material may be deposited so as to provide a thicker etchstop over off-target landing pad areas. This optional additional etchstop material may be different than the conformal etchstop material and can be tuned with respect to etch selectivity only so as to ensure that the landed portion of the via etch breaches the conformal etchstop to make connection with the underlying metal line before the unlanded portion of the via etch breaches the conformal etch stop layer. Numerous suitable etchstop materials, ILD materials (sometimes referred to as dielectrics or insulator materials), metal/alloy materials (sometimes referred to as fill metal, nucleation metal or seed metal), and/or any alternative intervening material and, as well as numerous suitable fabrication processes (e.g., wet/dry etching, lithography, chemical vapor deposition, atomic layer deposition, spin-on deposition, physical vapor deposition, electroplating, electroless deposition, etc.), can be used to implement an embodiment of the present invention, as will be appreciated in light of this disclosure.

Interconnect Structures with Bilayer Insulator

FIGS. 2A-F illustrate cross-section side views of a series of integrated circuit structures showing formation of an interconnect feature configured in accordance with an embodiment of the present invention. Each of FIGS. 2A-F illustrates a base ILD layer with three metal or otherwise conductive lines, each labeled Metal A-C, formed or otherwise embedded therein. Each of metal lines A-C may be made of the same or different conductive materials, depending on the specific application.

Figure 2A:
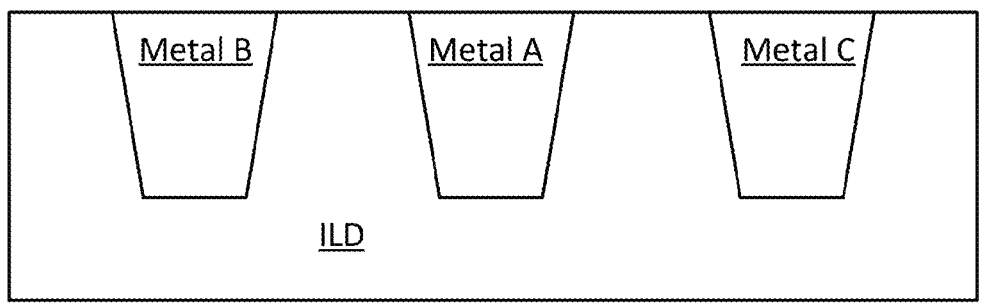
FIGS. 2A-F illustrate cross-section side views of a series of integrated circuit structures showing formation of an interconnect feature in accordance with an embodiment of the present invention.

As can be seen, FIG. 2A illustrates an ILD layer having a number of metal lines embedded therein. As will be appreciated in light of this disclosure, the structure may be formed as part of, or otherwise on, a substrate and may be configured in a number of ways and using any number of materials. Each of the ILD and metal or otherwise conductive line or wires can be deposited using conventional processes, such as chemical vapor decomposition (CVD), atomic layer deposition (ALD), spin-on deposition (SOD), physical vapor decomposition (PVD), or other suitable deposition processes, and then be planarized as commonly done (e.g., by way of chemical mechanical planarization, or CMP). The ILD and metal or otherwise conductive lines/wires can vary greatly in thickness, but in some example embodiments the ILD layer is in the range of 50 nm to 5000 nm. The ILD layer may include multiple sub-layers in some embodiments (of the same or different materials), or may be a single layer. In some embodiments, the trench where the metal lines are formed may be lined with a barrier layer (to prevent electromigration into the ILD) and/or a seed layer (to assist in metallization of the trench), and/or any other desired layers.

Figure 2B:
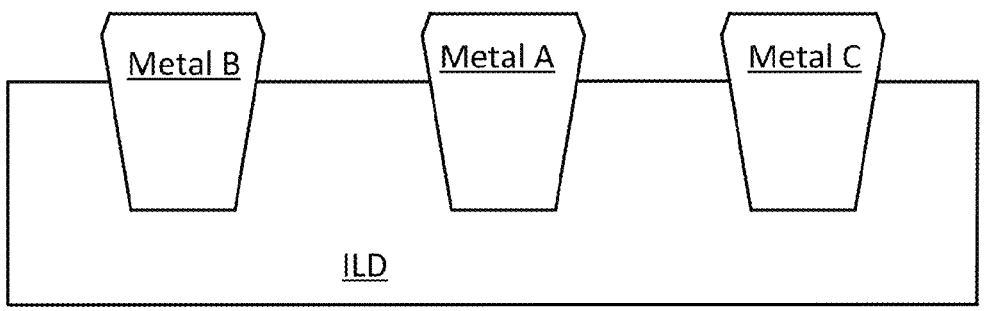

As shown in FIG. 2B, a relatively short unmasked etch can be applied to the ILD and metal lines. In one embodiment, the etch rate of the metal is lower than the etch rate of the ILD, such that trenches are formed in the ILD between the metal lines while only the sharp edges of the metal lines are rounded or softened by the etch process. In one specific embodiment, the metal lines may be copper. In such an embodiment, because copper does not have volatile fluorides, the unmasked etch may be performed using any suitable fluorinated etch. Although only three metal lines are shown in this example, any number of metalized trenches may be present. Any suitable lithography patterning and etch processes can be used to etch the ILD and metal (e.g., wet and/or dry, isotropic and/or anisotropic, etc.). Any suitable ILD and fill metal may be implemented, so long as the metal (or conductive material) has a lower etch rate than the ILD material allowing for the formation of the rounded edges/corners on the metal lines rising above the ILD, in accordance with an embodiment of the present invention.

Figure 2C:
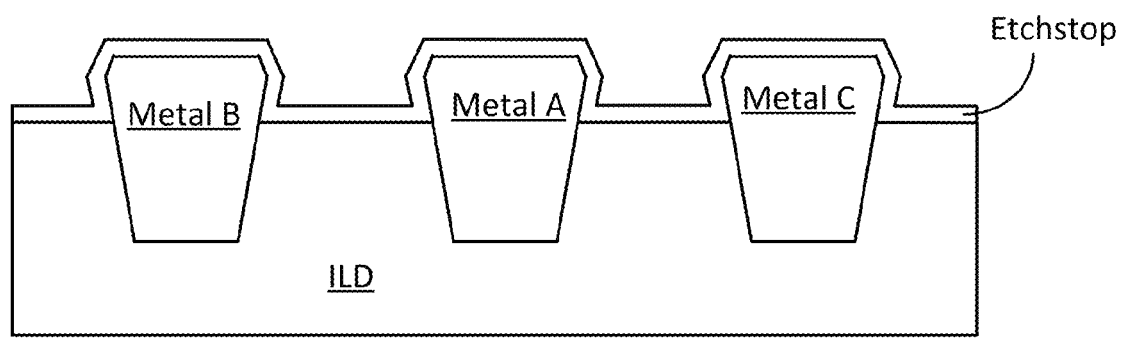
Figure 2D:
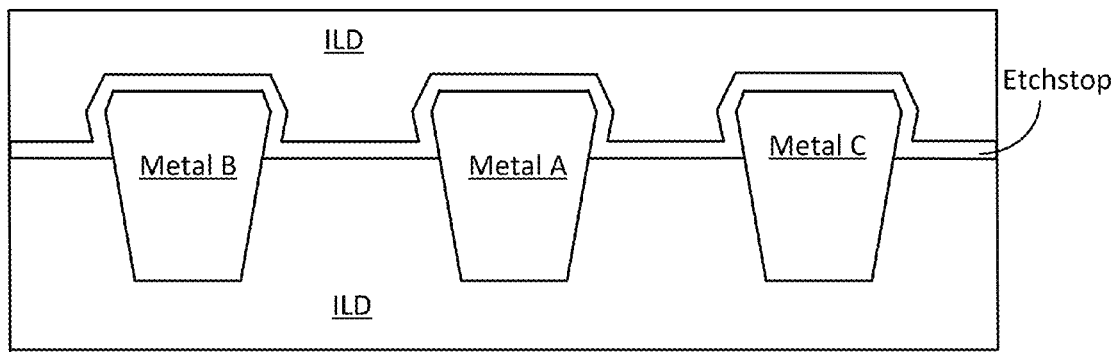

As shown in FIG. 2C, a conformal etchstop layer may be deposited on the ILD and metal lines. The etchstop layer can be deposited using any suitable deposition technique (e.g., ALD, CVD, PVD, etc.). In some embodiments, the etchstop layer can be CVD SiN or SiNC, PECVD SiN, or SiNC, an ALD dielectric process such as $Al_2O_3$ or $HfO_2$, or other suitable materials (such as those materials typically used for passivation, etchstops, and electromigration barriers). In some example cases, the etchstop layer has a thickness in the range of, for instance, 2 nm and 200 nm (e.g., 30 nm to 50 nm). As will be appreciated in light of this disclosure, the thickness of the etchstop layer can vary greatly, and the techniques disclosed are not intended to be limited to any particular range of thicknesses. A second ILD layer included in the stacked integrated circuit structure may then be provided, as shown in FIG. 2D using processes and materials as previously described with reference to FIG. 2A. The first and second ILD layers may be the same material, but may also be different materials as will be appreciated in light of this disclosure.

Example ILD insulator materials that can be used include, for example, nitrides, oxides, oxynitrides, oxycarbides, polymers, silanes, siloxanes, or other suitable insulator materials. In some embodiments, the ILD may be implemented with ultra-low-k insulator materials (having a low dielectric constant relative to $SiO_2$) and the conformal etchstop layer may be implemented with a material having a higher dielectric constant than the ILD materials and a higher resistance to dielectric breakdown. Ultra-low dielectric materials may generally have greater porosity and therefore a faster etch rate relative to denser materials having higher dielectric constants. Example low-k dielectric materials include silicon dioxide, carbon doped oxide (CDO), organic polymers such as perfluorocyclobutane or polytetrafluoroethylene, fluorosilicate glass (FSG), and organosilicates such as silsesquioxane, siloxane, or organosilicate glass. Examples of ultra-low-k dielectric materials generally include any such low-k materials, but configured with pores or other voids to further reduce density and dielectric constant. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The metal can be any suitable metal or suitable conductive material (e.g., copper, nickel, silver, gold, platinum, cobalt, tungsten, or alloys thereof such as copper-cobalt, copper-tin, cobalt-phosphorous-tungsten, nickel-phosphorous-tungsten, or any other suitable fill metal).

In some specific embodiments, the ILD material may be, for example, an ultra-low dielectric material such as a porous SiCOH having a dielectric constant k of less than 2.3 and porosity greater than 35 volume %. In such example cases, the etchstop layer can be, for instance, a relatively denser SiCOH having a dielectric constant k in the range of about 2.8 to 3.0, and a porosity of less than 10 volume % or a plasma enhanced CVD (PECVD) oxide (e.g., silicon dioxide) or nitride (e.g., silicon nitride). In such example cases, the fill metal can be copper with an etch rate lower than the etch rate of the ILD material. In this specific example, an etch process with greater than 10:1 selectivity in the etch of the fill metal and ILD layer is achieved.

Figure 2E:
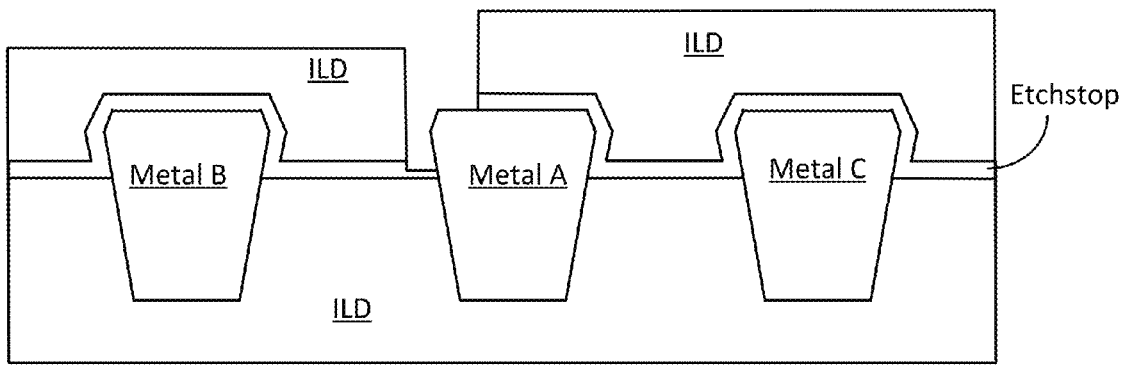

An unlanded via may be patterned and etched through the upper ILD material, as shown in FIG. 2E. As can be seen, the via is shifted in this example toward the neighboring line, metal B, such that a portion of the via is over metal A, while a portion of the via is over the off-target landing pad. The via can be formed in the ILD bilayer, for example, using standard lithography including via patterning and subsequent etch processes followed by polishing, cleans, etc. as typically done. The patterning and etch processes can be carried out, for instance, using wet and/or dry etch techniques. The via dimensions can vary, depending on the application. In one example case, the via opening is about 5 nm to 500 nm (e.g., 20 to 45 nm), and has an aspect ratio in the range of about 8:1 to 2:1 (e.g., 4:1). In other embodiments, note that the via may be part of a dual damascene structure that includes the via and an upper wider trench portion. As will be appreciated, the dimensions and aspect ratio of the desired interconnect structure will vary from one embodiment to the next, and the techniques disclosed are not intended to be limited to any particular range of dimensions or structural configuration (e.g., single or dual damascene, etc.). In one specific example, due to the vertical offset of the etchstop over the off-target landing pad as compared to the etchstop over metal A, the landed portion of the via etch may contact the top of metal A before the unlanded portion of the via etch penetrates through the etchstop of the off-target landing pad.

Figure 2F:
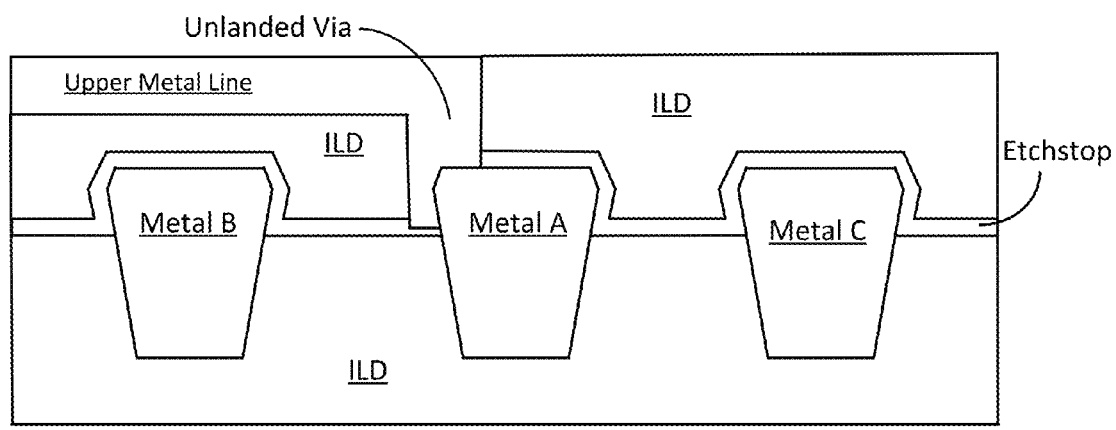

As shown in FIG. 2F, the upper metal line and the substantially vertical unlanded via may be metalized using materials and processes similar to those discussed with reference to FIG. 2A and may or may not include an additional support layer (e.g., diffusion barrier, nucleation layer, adhesion layer, and/or other desired layers). As will be further appreciated in light of this disclosure, eliminating the sharp corners of the adjacent metal line reduces the E-field between metal B and the unlanded via, as well as increasing the distance between metal B and the unlanded via. Additionally, because the unlanded portion of the via does not penetrate the etchstop above the off-target landing pad in this particular embodiment, the E-field between the via and the adjacent metal B is reduced across the etchstop, in accordance with some embodiments. Thus, the possibility of shorting to the neighboring metal B is reduced. Note that other embodiments may allow the unlanded portion of the via to penetrate the etchstop, but risk of shorting is still reduced.

FIGS. 3A-D illustrate cross-sectional side views of a series of integrated circuit structures showing formation of an interconnect feature configured in accordance with another embodiment of the present invention. Each of FIGS. 3A-D illustrates a base ILD layer with three metal lines, Metal A-C, formed or otherwise embedded therein. As previously explained, the ILD insulator layer may be formed as part of, or otherwise on, a substrate and may be configured in a number of ways and using any number of materials, as will be appreciated in light of this disclosure. Factors such as desired dielectric constant can be used to select the insulator material, which can be, for instance, any of the previously described insulator materials. The ILD and metal lines can be etched and coated with an etchstop layer as shown in FIGS. 2A-C, and previous relevant discussion with respect to those figures is equally applicable here. In this specific example embodiment, the etchstop layer may be further coated so as to effectively extend the etchstop layer in the areas between the metal lines, so as to provide an optional extended etchstop layer (OEEL). In some embodiments, this optional layer can be implemented with, for example, a flowable carbide or flowable nitride layer. In some such embodiments, the flowable layer can have a lower k value than the conformal etchstop material, and various materials may be used based on the desired etch selectivity. An example flowable carbide material that may be used is a spin-on carbide commercially available through various suppliers. The flowable material may also be a PECVD-deposited material, e.g., as deposited with the Eterna™ FCVD™ process of Applied Materials, Inc.

Figure 3A:
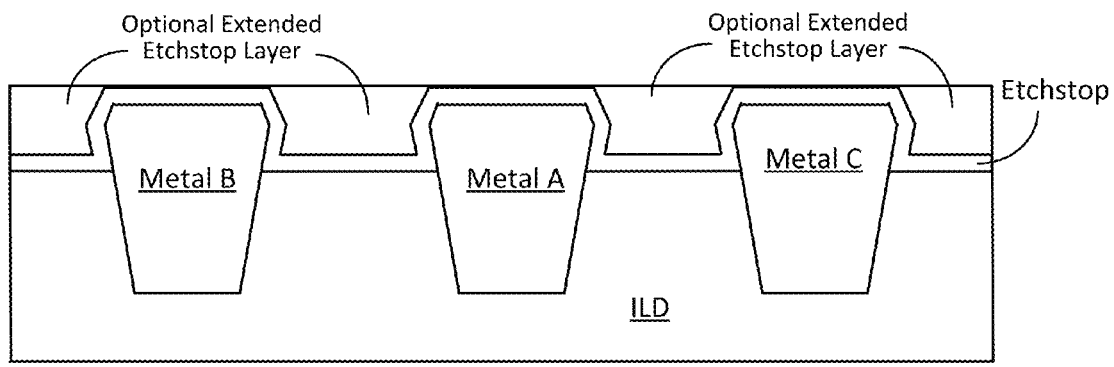
FIGS. 3A-D illustrate cross-section side views of a series of integrated circuit structures showing formation of an interconnect feature in accordance with another embodiment of the present invention.
Figure 3B:
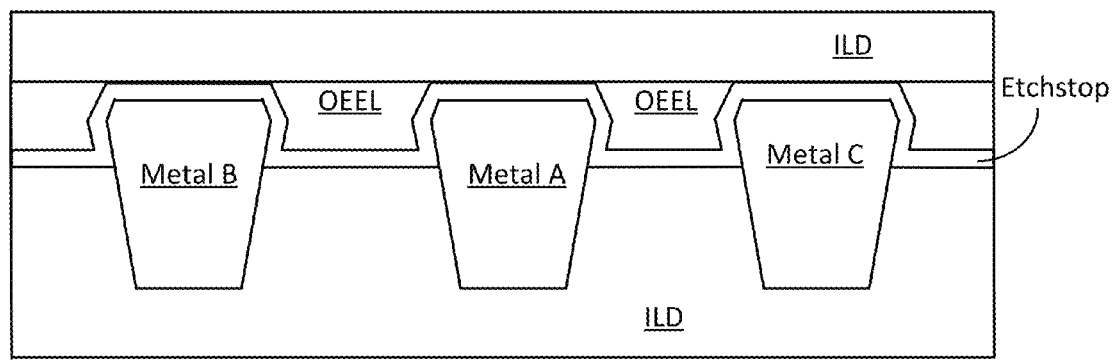

In the specific example shown in FIG. 3A, the optional extended etchstop layer may be deposited over the conformal etchstop layer using any suitable deposition technique (e.g., ALD, CVD, PVD, etc.). In one particular example embodiment, a flowable carbide may be deposited on the wafer such that the top of the carbide layer is about the same height as the high points of the underlying conformal etchstop layer covering the various metal lines. The optional extended etchstop layer thickness may vary from one embodiment to the next, and in some embodiments the flowable layer can merely fills the spaces between the metal lines, while in other embodiments it may cover the etchstop above the metal lines with a relatively thin layer (e.g., ranging from a monolayer to 10 nm, or otherwise, so long as a desired etch profile between the off-target landing pad and the target landing pad can be achieved). In some embodiments, the actual layer thickness may vary greatly from one point to the next along the flowable layer, and achieving a perfectly smooth upper surface as shown in FIG. 3A is not necessary. In one specific example, a flowable carbide layer effectively increases the thickness of the conformal etchstop layer above the off-target landing pad, thus improving the ability of the unlanded portion of the via to not penetrate below the conformal etchstop. The thickness differential that may be achieved with a flowable OEEL material allows for greater etch selectivity. As shown in FIG. 3B, after deposition of the optional flowable layer, an upper ILD layer may be provided using processes and materials as previously described with reference to FIG. 2A.

Figure 3C:
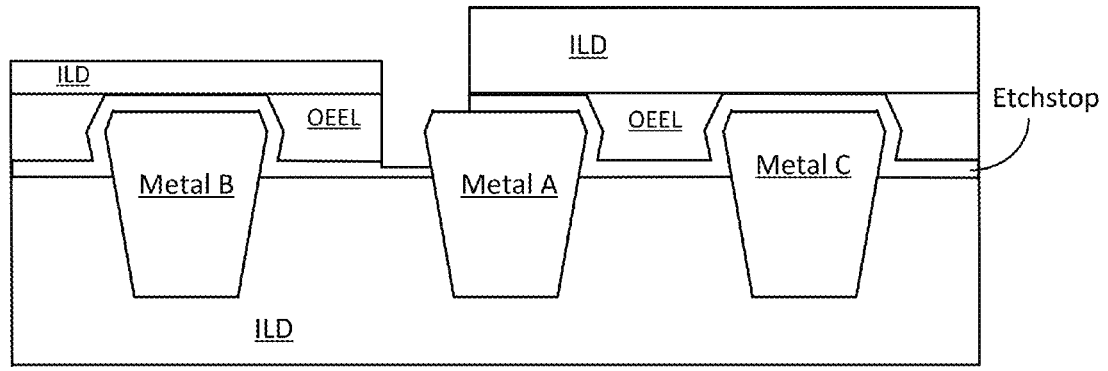

After deposition of the upper ILD layer, an unlanded via may be patterned and etched, as shown in FIG. 3C. The previous relevant discussion with respect to patterning and etching an unlanded via is equally applicable here. In this specific example embodiment, the via etch penetrates through the upper ILD layer, through the flowable carbide layer, and through the etchstop layer above metal A. In this example, however, a portion of the etchstop layer remains in the off-target landing pad to the left of metal A. This may be achieved because of the thickness differential of the flowable layer, as well as the vertical offset of the conformal etchstop above metal A as compared to the conformal etchstop covering the ILD layer.

Figure 3D:
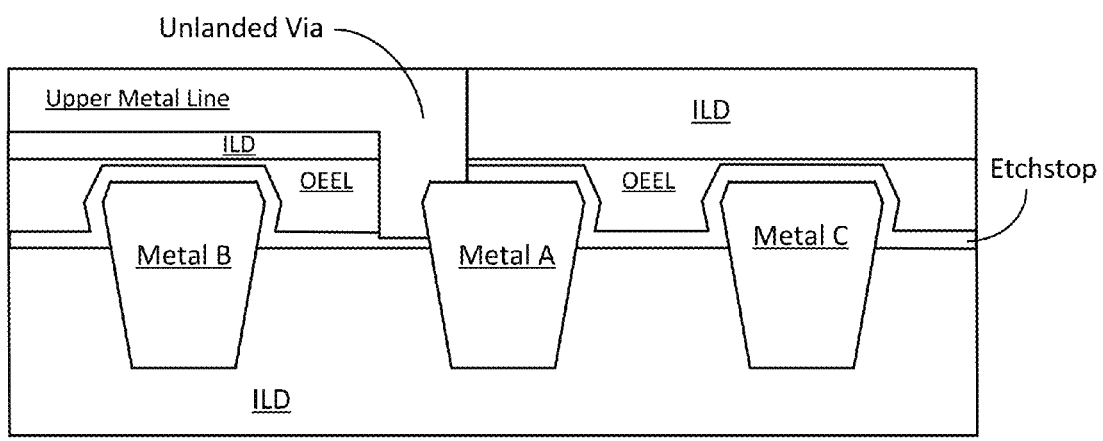

As shown in FIG. 3D, the upper metal line and the substantially vertical unlanded via may be metalized using materials and processes similar to those discussed with reference to FIG. 2A and may or may not include an additional support layer (e.g., diffusion barrier, nucleation layer, adhesion layer, and/or other desired layers). Eliminating or otherwise diminishing the sharp corners of the adjacent metal B can reduce the E-field between metal B and the unlanded via, as well as increase the distance between metal B and the unlanded via. According to this specific embodiment, the rounded edges of the metal lines, the conformal etchstop layer, and the flowable carbide layer all contribute to reducing the possibility of dielectric breakdown between the unlanded via and the adjacent metal B.

Figure 4:
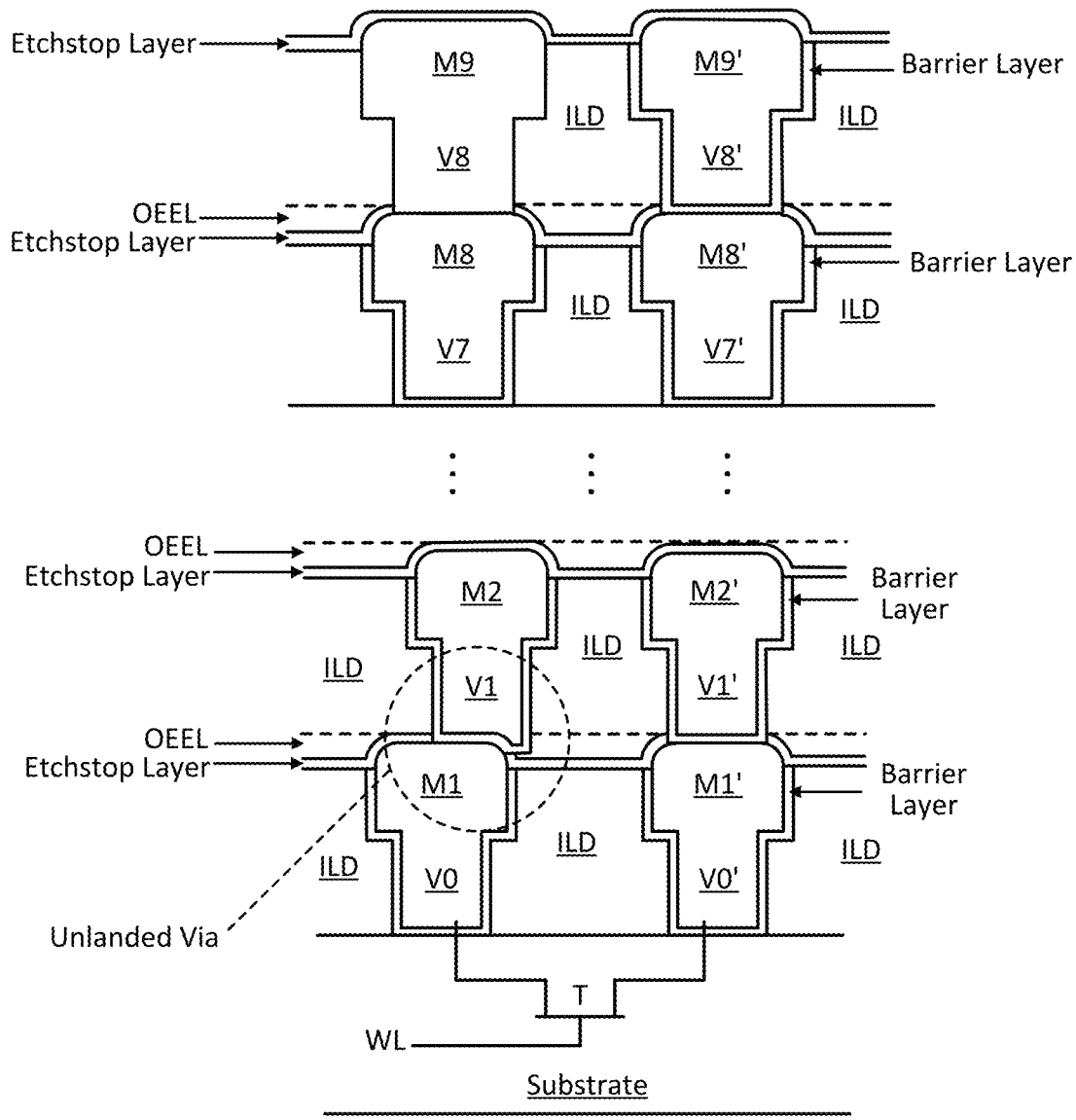
FIG. 4 shows a specific example embodiment where the underlying metal landing pad is a metal line of a lower layer in a dynamic random access memory (DRAM) integrated circuit structure.

FIG. 4 shows a specific example embodiment where the underlying metal landing pad is a metal line of a lower layer in a dynamic random access memory (DRAM) integrated circuit structure. Note, however, any number of other multi-layer integrated circuits may have a similar stacked structure. As can be seen, the integrated circuit may include a plurality of stacked interconnect layers on top of the substrate. In this example case, the substrate is configured with various DRAM cell components integrated therein, such as access transistor T and word line WL. Such DRAM devices typically include a plurality of bit cells, with each cell generally including a storage capacitor communicatively coupled to a bitline by way of an access transistor that is gated by a word line. Other typical DRAM components and features not shown can also be included (e.g., row and column select circuitry, sense circuitry, power select circuitry, etc). Each layer includes various metal lines (M1, M1', M2, M2' . . . M9, and M9') and corresponding vias (V0, V0', V1, V1' . . . V8 and V8') formed within an ILD material. Note that the layout shown is not intended to implicate any particular feature, spacing, or density. Rather, this layout is simply an arbitrary example, and any number of layout designs can benefit from an embodiment of the present invention, where conductive interconnect features are formed as described herein. In this specific embodiment, the etch rate of the metal lines is lower than that of the ILD material for a given etch chemistry, and each ILD layer and metal line has been subjected to an unmasked etch such that the ILD layer is etched lower than the metal line, while the edges of the metal lines are rounded/softened. In addition, each metal line and via of this example embodiment may be configured with an optional conductive barrier layer (e.g., tantalum or other diffusion barrier). Other embodiments may include fewer or more such layers (e.g., nucleation layers, adhesion layers, etc.).

In this particular example case, FIG. 4 shows how via V1 is unlanded and electrically connects metal line M2 to the underlying metal line M1. Note how this unlanded via can be one of many vias, and can also be the only one that is unlanded, or one of many unlanded vias. The off-target landing may be, for instance, due to registration errors, or may be intentional. In any case, and as will be appreciated in light of this disclosure, the differential etch rate of the metal lines as compared to the ILD material yields a vertical offset between the metal lines and the ILD material, as well as an adjacent metal line M1' with rounded or tapered upper edges as opposed to sharp edges. As shown in this example, a conformal etchstop layer may be deposited over the rounded/tapered metal lines and the ILD material. In this specific example, the vertical offset of the metal lines as compared to the ILD helps prevent via V1 from penetrating through the etchstop layer between metal lines M1 and M1'. The rounded/tapered metal lines may substantially decrease the E-field between via V1 and adjacent line M1', as well as increase the distance between the via and adjacent line. Additionally, because via V1 has not penetrated the underlying conformal etchstop layer between metal lines M1 and M1' in this example case, the E-field between the via and adjacent line may decrease across the etchstop. Thus, in one embodiment of the present invention, the risk of dielectric breakdown between an unlanded via and an adjacent metal line may be decreased because of the reduced E-fields described above. In one embodiment, a device may include one or more lower levels of metallization that have metal lines with rounded/tapered edges as described herein, while also having one or more higher levels of metallization where the metal lines lack such rounded/tapered edges. For example, the lower layers that include M1/V0 and M2/V1 may include rounded metal lines as described herein. In that same device, the upper layers that include M8/V7 and M9/V8 may have metal lines without such intentionally rounded edges/corners.

Figure 5A:
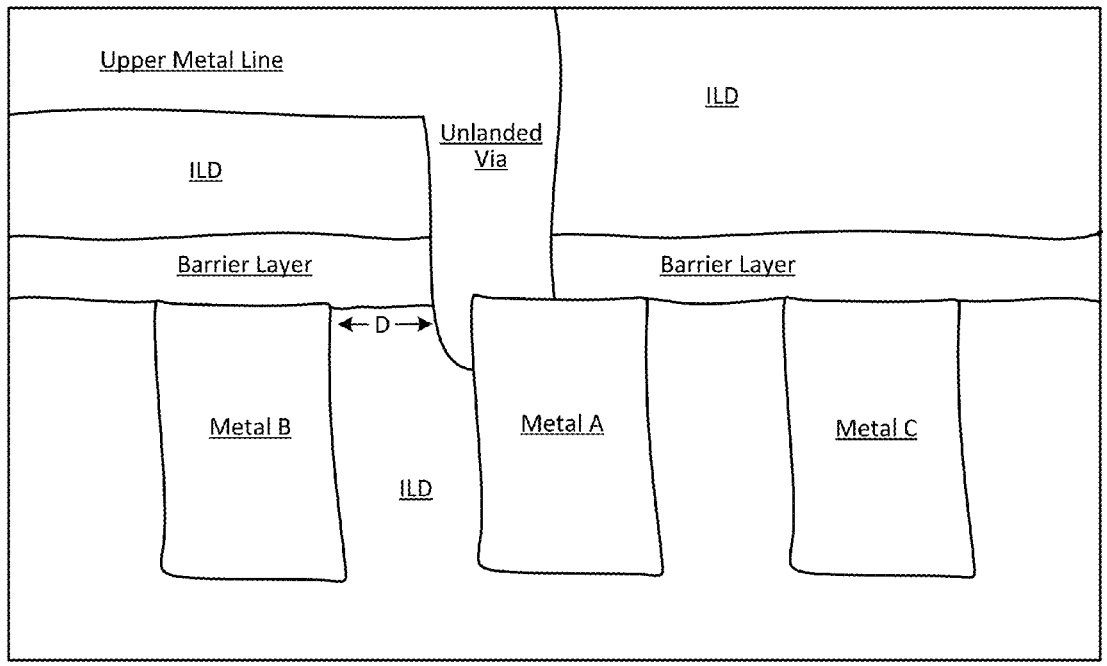
FIG. 5A shows a cross-sectional view of an interconnect structure with an unlanded via.
Figure 5B:
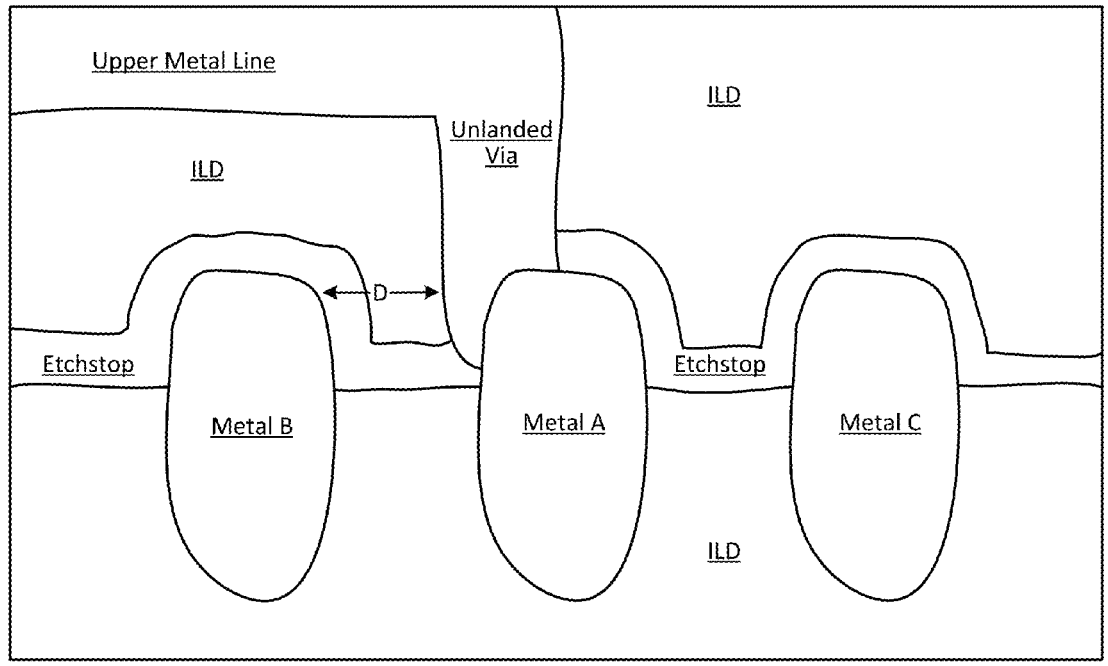
FIG. 5B illustrates a cross-sectional view of an interconnect structure with an unlanded via configured in accordance with one embodiment of the present invention.

FIG. 5A shows a cross-sectional view of an interconnect structure with an unlanded via connected to metal A. FIG. 5B illustrates a cross-sectional view of an unlanded via configured in accordance with one embodiment of the present invention. As can be seen, FIGS. 5A and 5B are drawn to reflect real world process limitations, in that the features are not drawn with precise right angles and straight lines. As can be seen in FIG. 5A, the metal lines A-C have relatively sharp upper corners. These corners can enhance the E-field between the lines and any adjacent interconnects or lines. Specifically, the E-field between metal B and the unlanded via may be enhanced by the sharp corner on the upper right edge of metal B. In this particular example, the unlanded via penetrates through the upper ILD layer, and also through the optional barrier layer covering the metal lines A-C and the lower ILD layer, connecting the upper metal line to metal A. Further note in this example that the via also penetrates within the lower ILD layer near metal A, decreasing the distance D between the via and adjacent metal B.

As can be seen in FIG. 5B, the upper edges of the metal lines A-C have been intentionally rounded or tapered or otherwise softened and the lower ILD layer has been etched below the tops of the metal lines, resulting in a vertical offset between the ILD material and the top of the metal lines. Specifically, the softened upper edges of metal B increase the distance D between it and the unlanded via, and also decrease the E-field between the unlanded via, as compared to the example shown in FIG. 5A. As can be further seen in this example embodiment, a conformal etchstop layer is deposited over the ILD material and metal lines. In such an example, the unlanded via can penetrate through the upper ILD layer as well as through the etchstop layer covering metal A, connecting the upper metal line to metal A. In this particular embodiment, however, the via does not penetrate through the etchstop covering the off-target landing pad. The E-field between metal B and the unlanded via may drop across the etchstop because the via does not penetrate the etchstop of the off-target landing pad in this example. The resulting interconnect structure may have a significantly lower E-field as compared to the example shown in FIG. 5A, thus increasing the structure's resistance to dielectric breakdown.

FIG. 6A illustrates a simulation of the E-field strength in a conventional stacked conductive interconnect structure (such as the one shown in FIG. 1). FIG. 6B illustrates a simulation of the E-field strength in a stacked conductive interconnect structure configured in accordance with an embodiment of the present invention (such as the ones shown in FIG. 2F, 3D, 4, or 5B). As can be seen in FIG. 6A, the metal line of the conventional structure has a sharp corner which may create a strong E-field between it and the adjacent unlanded via. The dark area near the corner of the metal line shows the area with the strongest E-field. As can be seen in FIG. 6B, the sharp corner of the metal line has been rounded by an etch or other suitable process, according to one embodiment of the present invention, thus reducing the strongest E-field between it and the adjacent unlanded via. In one specific embodiment, the E-field between the unlanded via and the adjacent metal line is 15% lower in the ILD and 30% lower overall when the metal line edges are rounded as compared to the conventional stacked conductive interconnect structure.

Example System

Figure 7:
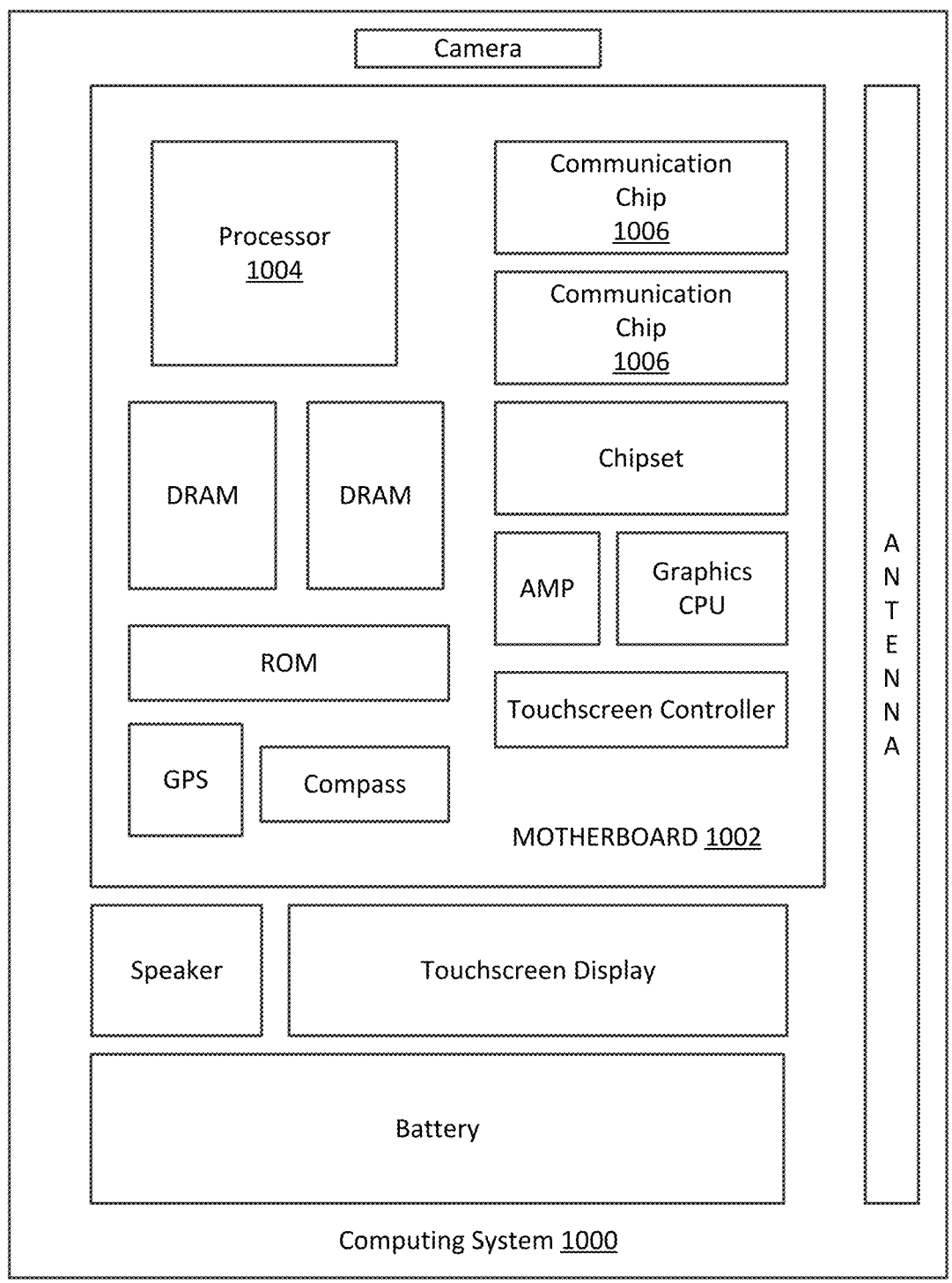
FIG. 7 illustrates an example computing system having one or more devices implemented with conductive structures formed in accordance with an embodiment of the present invention.

FIG. 7 illustrates a computing system 1000 implemented with one or more integrated circuit structures configured and/or otherwise fabricated in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with one or more conductive interconnect features having rounded/tapered metal lines, as variously described herein. These integrated circuit structures can be used, for instance, to implement an on-board processor cache or memory array or other circuit feature that includes interconnects. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures configured with one or more self-enclosed conductive interconnect features having rounded metal lines, as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more integrated circuit structures formed as variously described herein (e.g., on-chip processor or memory having rounded/tapered metal lines). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processors 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs integrated circuit features configured with one or more conductive interconnect features having rounded or otherwise softened metal lines, as variously described herein.

Numerous embodiments will be apparent, and features described herein can be combined in any number of configurations. One example embodiment of the present invention provides a semiconductor device. The device includes a first insulator structure, a first conductive feature partially within the first insulator structure with a portion of the first conductive feature at least partially protruding beyond a surface of the first insulator structure. The device further includes a second insulator structure with a second conductive feature therein. The device further includes a conformal intervening layer located between the first and second insulator structures such that the first insulator structure, the intervening layer, and the second insulator structure are arranged in a stack. The device further includes a conductive interconnect feature which connects the first conductive feature with the second conductive feature by passing through the conformal intervening layer and landing on the first conductive feature. In some cases, the conformal intervening layer conforms to the protruding portion of the conductive feature of the first insulator structure. In one such case, the conductive interconnect feature is an unlanded via. In one such case, the unlanded portion of the unlanded via does not penetrate the conformal intervening layer. In some cases, the ratio of the first insulator structure etch rate to the first conductive feature etch rate for a given etch process is greater than 3. In some cases, the conformal intervening layer is a conformal etchstop layer deposited over the first insulator structure and the first conductive feature, and the portion of the first conductive feature at least partially protruding beyond the surface of the first insulator structure has rounded corners. In one such case, an additional insulator layer is included between the conformal intervening layer and the second insulator structure and adjacent to sides of the protruding portion of the first conductive feature, wherein the conductive interconnect feature passes through the additional insulator layer. In one such case, the additional insulator layer is either a flowable carbide or flowable nitride deposited over the conformal intervening layer. In some cases, the additional insulator layer includes an etchstop material, effectively increasing the thickness of portions of the conformal etchstop layer. In some cases the first and second insulator structures each include an ultra-low dielectric material having a dielectric constant below that of silicon dioxide, and the conformal intervening layer includes a dielectric material having a higher dielectric constant than the ultra-low dielectric material.

Another embodiment of the present invention provides a multilayer integrated circuit device. In this example case, the device includes a first insulator structure having one or more metal features within an insulator material, the one or more metal features having a portion at least partially protruding beyond a surface of the first insulator structure, the protruding portion having rounded corners. The device further includes a second insulator structure having one or more metal features embedded within an insulator material. The device further includes a conformal etchstop layer between the first and second insulator structures, wherein the first insulator structure, etchstop layer, and second insulator structure are arranged in a stack. The device further includes a conductive interconnect feature connecting one of the metal features of the first insulator structure to one of the metal features of the second insulator structure, a portion of the conductive feature passing through the conformal etchstop layer and landing on at least one of the rounded corners of one of the metal features of the first insulator structure. In some cases, the conductive interconnect feature is an unlanded via. In one such case, the unlanded portion of the unlanded via does not penetrate the conformal etchstop layer. In another such case, the rounded corners of the one or more metal features increase the distance between the unlanded via and an adjacent metal feature, relative to the distance between those two if the adjacent metal feature were not partially rounded. In some cases, the device further includes an additional insulator layer between the conformal etchstop layer and the second insulator structure. In one such case, the additional insulator layer is a flowable carbide or a flowable nitride material. In another such case, the additional insulator layer includes an etchstop material which effectively increases the thickness of the conformal etchstop layer between the one or more metal features of the first insulator structure.

Another embodiment of the present invention provides a method of forming a semiconductor device. In this example case, the method includes: providing a first insulator structure with a first metal feature within an insulator material; etching the first insulator structure so as to recess the insulator material to be lower than the first metal feature and to round corners of the first metal feature; depositing a conformal etchstop layer over the etched insulator material and the rounded first metal feature; depositing a second insulator structure having a second metal feature embedded within an insulator material; and connecting the first metal feature to the second metal feature with a conductive interconnect feature. In some cases, the conductive interconnect feature is an unlanded via. In one such case, the unlanded portion of the unlanded via does not penetrate the conformal etchstop layer. In some cases, the method further includes depositing a flowable barrier layer over the conformal etchstop layer before depositing the second insulator structure. In one such case, the flowable barrier layer is a flowable carbide or a flowable nitride material. In some cases, etching the first insulator structure includes applying an unmasked etch to the first insulator structure, wherein the etch rate of the insulator material is greater than the etch rate of the first metal feature.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A semiconductor device, comprising a conductive interconnect feature connecting a first conductive feature with a second conductive feature, the conductive interconnect feature passing through a conformal intervening layer and partially landing on the first conductive feature, wherein the unlanded portion of the conductive interconnect feature rests on but does not penetrate the conformal intervening layer.

2. The device of claim 1 wherein the conformal intervening layer conforms to a protruding portion of the first conductive feature that extends beyond an insulator layer.

3. The device of claim 1, wherein the first conductive feature is included in a first insulator layer, and the second conductive feature is included in a second insulator layer, and the first insulator layer, conformal intervening layer, and second insulator layer are arranged in a stack.

4. The device of claim 1, wherein a protruding portion of the first conductive feature extends beyond an insulator layer, the protruding portion having a rounded corner with which the conductive interconnect feature connects.

5. The device of claim 1, wherein the first conductive feature is included in a first insulator layer, and the ratio of first insulator layer etch rate to the first conductive feature etch rate for a given etch process is greater than 3.

6. The device of claim 1, wherein a portion of the first conductive feature at least partially protrudes from a first insulator layer, and the conformal intervening layer is at least partially on and conforms to the protruding portion.

7. The device of claim 6, further comprising an additional insulator layer at least partially on the conformal intervening layer, wherein the conductive interconnect feature further passes through the additional insulator layer.

8. The device of claim 7, wherein the additional insulator layer comprises a flowable dielectric material.

9. The device of claim 8, wherein the flowable dielectric material is one of a flowable carbide or flowable nitride.

10. The device of claim 1, wherein the first conductive feature is included in a first insulator layer, and the second conductive feature is included in a second insulator layer, and at least one of the first and second insulator layers comprises an ultra-low dielectric material having a dielectric constant below that of silicon dioxide, and the conformal intervening layer comprises a dielectric material having a higher dielectric constant than the ultra-low dielectric material.

11. A mobile computing system comprising the device of claim 1.

12. A microprocessor comprising the device of claim 1.

13. A memory circuit comprising the device of claim 1.

14. A semiconductor structure, comprising:
a first insulator layer having a first conductive feature;
a second insulator layer having a second conductive feature protruding therefrom;
a conformal dielectric layer at least partially on and conforming to the protruding portion of the second conductive feature; and
a conductive interconnect feature connecting the first conductive feature with the second conductive feature, the conductive interconnect feature passing through the conformal dielectric layer and partially landing on the second conductive feature so as to provide an unlanded portion of the conductive interconnect feature, wherein the unlanded portion of the conductive interconnect feature rests on but does not penetrate the conformal intervening layer.

15. The structure of claim 14, wherein the first insulator layer, conformal dielectric layer, and second insulator layer are arranged in a stack.

16. The structure of claim 14, wherein the protruding portion of the second conductive feature has a rounded corner with which the conductive interconnect feature connects.

17. The structure of claim 14, wherein the ratio of first insulator layer etch rate to the first conductive feature etch rate for a given etch process is greater than 3.

18. A semiconductor structure, comprising:
a conductive interconnect feature connecting a first conductive feature with a second conductive feature, the conductive interconnect feature passing through a conformal dielectric layer and partially landing on the first conductive feature so as to provide an unlanded portion of the conductive interconnect feature, wherein the unlanded portion of the conductive interconnect feature rests on but does not penetrate the conformal intervening layer; and
an insulator layer at least partially on the conformal dielectric layer, wherein the conductive interconnect feature further passes through the insulator layer.

19. The structure of claim 18, wherein the additional insulator layer comprises a flowable dielectric material.

20. The structure of claim 19, wherein the flowable dielectric material is one of a flowable carbide or flowable nitride.

* * * * *